United States Patent
Mease et al.

(10) Patent No.: US 6,987,667 B1
(45) Date of Patent: Jan. 17, 2006

(54) COMPUTER SYSTEM AND METHOD CONFIGURED FOR IMPROVED COOLING

(75) Inventors: Keith D. Mease, Gibbstown, NJ (US); Grant M. Smith, Bryn Athyn, PA (US)

(73) Assignee: Unisys Corporation, Blue Bell, PA (US)

( * ) Notice: Subject to any disclaimer, the term of this patent is extended or adjusted under 35 U.S.C. 154(b) by 223 days.

(21) Appl. No.: 10/390,370

(22) Filed: Mar. 17, 2003

(51) Int. Cl.
*G06F 1/20* (2006.01)

(52) U.S. Cl. .................... 361/687; 361/752; 312/223.6; 364/708.1

(58) Field of Classification Search ......... 361/679–687, 361/724–729, 752; 312/223.1–223.6; 364/708.1; 454/181
See application file for complete search history.

(56) References Cited

U.S. PATENT DOCUMENTS

| | | | |
|---|---|---|---|
| 5,317,481 A | 5/1994 | Hillis et al. | |
| 6,078,503 A | 6/2000 | Gallagher et al. | |
| 6,128,196 A | 10/2000 | Hoyle, Jr. et al. | |
| 6,459,579 B1 * | 10/2002 | Farmer et al. | 361/695 |
| 6,556,440 B2 * | 4/2003 | Jensen et al. | 361/687 |
| 6,628,518 B2 * | 9/2003 | Behl et al. | 361/687 |
| 2003/0117782 A1 * | 6/2003 | Wrycraft et al. | 361/752 |

FOREIGN PATENT DOCUMENTS

GB  2 381 953  5/2003

OTHER PUBLICATIONS

International Search Report Dated Oct. 1, 2004.

* cited by examiner

*Primary Examiner*—Hung Van Duong
(74) *Attorney, Agent, or Firm*—Lise A. Rode; Mark T. Starr; RatnerPrestia

(57) ABSTRACT

A computer subassembly is configured to be mounted within a rack along an insertion axis. The computer subassembly includes a chassis configured for insertion into and removal from the rack along the insertion axis, wherein the chassis at least partially defines an interior. An interconnect assembly is mounted within or adjacent the interior of the chassis, and the interconnect assembly is oriented along a plane that is substantially parallel to the insertion axis. At lease one circuit assembly is positioned at least partially within the interior of the chassis and is connected to the interconnect assembly. The circuit assembly is oriented in a plane substantially parallel to the insertion axis. A source of cooling air is positioned to direct cooling air through the interior of the chassis along the insertion axis.

18 Claims, 8 Drawing Sheets

COMPUTER SYSTEM AND METHOD CONFIGURED FOR IMPROVED COOLING

FIELD OF THE INVENTION

This invention relates to a computer system and method configured for improved cooling. In particular, this invention relates to a computer system configured to be mounted within a rack and a method for configuring the computer system for improved cooling of the computer system.

BACKGROUND OF THE INVENTION

As processor speeds and frequencies increase, the power dissipation of the processors and the supporting circuit assemblies increase dramatically. Cooling, therefor, is becoming one of the major limitations to the ever-increasing performance of computer systems. Compounding this problem is the fact that the speed of computer chips can be dependent upon their temperature. As the temperature of such chips increases, the speed of the chips slows. Accordingly, there is an increasing need to lower the temperature of such chips.

Another challenge is raised by the fact that flight times between system elements must decrease in order to increase processor speeds and frequencies. To do so, it is desirable to either increase the velocity of flight or decrease the distance over which signals must travel. While the distance between processor and memory does not always play a significant role in system design, such distance may become a factor in systems with multiple processor and memory elements, in which the dimensions of the processor and memory elements begin to push the elements farther apart. Accordingly, in such systems, it has become a challenge to keep signal interconnect lengths short enough to meet system timing requirements. The resulting increase in system density makes it difficult to keep all of the closely-packed elements cool.

Especially in high end servers that connect multiple processor, memory, and input-output (I/O) units, there is a need to connect those components together. One way to accomplish such connection is the use of a back plane or mid plane design. With a back plane interconnect, the back plane resides in the rear of the system, and all of the removable computer components are plugged into the back plane. In a mid plane approach, the interconnect plane is moved into the interior of the system to allow boards to be plugged into both the front and rear of the mid plane. The use of such back planes or mid planes can, however, cause a thermal impact in rack-mounted computer designs. In such rack-mounted designs, a front-to-back air flow path is often desired, wherein the air flow enters the front of the unit and exits the rear of the unit. The back plane or mid plane approach can, however, hinder such front-to-back air flow.

Accordingly, there remains a need for a computer system and method configured for improved cooling.

SUMMARY OF THE INVENTION

According to one exemplary embodiment of this invention, a computer subassembly is configured to be mounted within a rack along an insertion axis. The computer subassembly includes a chassis configured for insertion into and removal from the rack along the insertion axis, wherein the chassis at least partially defines an interior. The computer subassembly also includes an interconnect assembly mounted within or adjacent the interior of the chassis, wherein the interconnect assembly is oriented along a plane substantially parallel to the insertion axis. The computer subassembly also includes at least one circuit assembly positioned at least partially within the interior of the chassis and connected to the interconnect assembly, wherein the circuit assembly is oriented in a plane substantially parallel to the insertion axis. A source of cooling air is positioned to direct cooling air through the interior of the chassis along the insertion axis.

According to another exemplary embodiment of the invention, the circuit assembly of the computer subassembly is sized for insertion and removal through an access opening of the chassis and into the interior of the chassis along the insertion axis. The circuit assembly is connected to the interconnect assembly along a connection axis that is oriented at an angle to the insertion axis. The circuit assembly is oriented in a plane substantially parallel to the insertion axis.

According to yet another embodiment of this invention, a method is provided for configuring a rack-mounted computer subassembly for improved cooling. The method includes orienting the interconnect assembly in a plane substantially parallel to an insertion axis along which the computer subassembly is inserted into a rack. The method also includes connecting at least one circuit assembly to the interconnect assembly along a connection axis angled with respect to the insertion axis and orienting the circuit assembly in a plane substantially parallel to the insertion axis. A source of cooling air is positioned to direct cooling air along the insertion axis.

BRIEF DESCRIPTION OF THE DRAWINGS

Exemplary embodiments of this invention will be described with reference to various figures selected for illustration of those exemplary embodiments. It will be appreciated, however, that this invention is not limited to the exemplary embodiments selected for illustration in the figures, of which:

FIG. 7 is a perspective view of components of the interconnect assembly illustrated in FIG. 6.

DETAILED DESCRIPTION OF THE INVENTION

Exemplary aspects of the invention will now be described with reference to the figures. It will be appreciated that variations and modifications of the exemplary embodiments illustrated and described herein may be made without departing from the spirit or scope of this invention. For example, the materials, sizes, proportions, and configurations of the illustrated embodiments can be changed, and the illustrated embodiments are not rendered to any specific proportion or scale.

Figure 1:
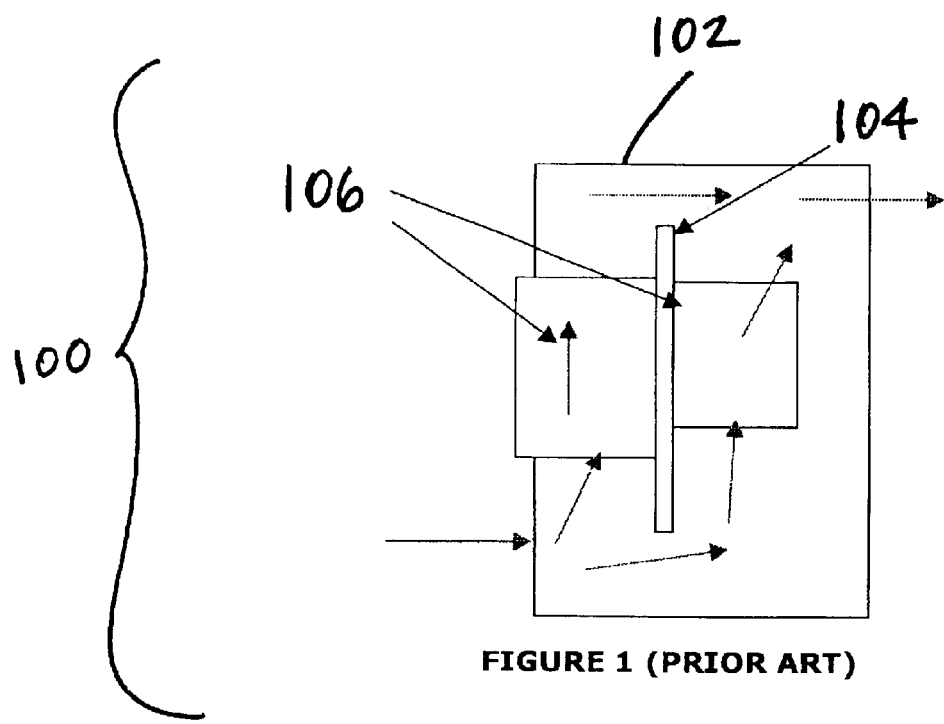
FIG. 1 is a side view of a computer assembly illustrating the use of a mid plane.
Figure 2:
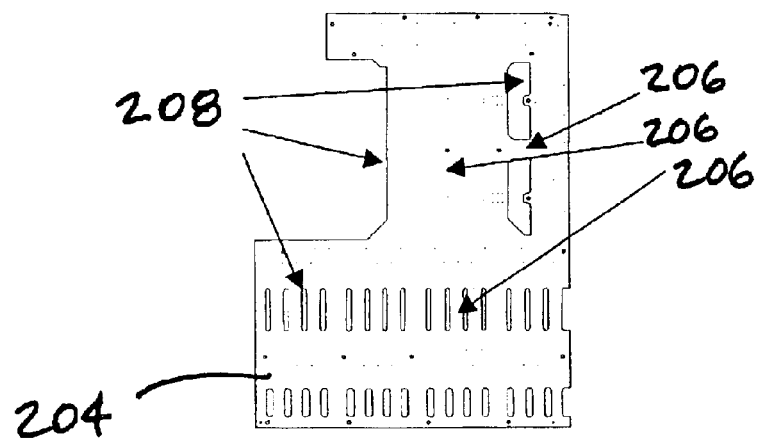
FIG. 2 is a front view of a mid plane having air flow cut outs to promote the flow of air through a computer system.

Referring first to FIGS. 1 and 2, various approaches have been considered to improve the cooling of computer systems. For example, as is illustrated in FIG. 1, a computer subassembly 100 can be provided with a chassis 102 in which a mid plane 104 is mounted. Circuit assemblies 106 (two shown) are mounted to the mid plane 104 for electrical coupling. As is illustrated by the arrows in FIG. 1, air flows from the front (left-hand side of FIG. 1) to the back (right-hand side of FIG. 1) of the computer subassembly 100.

In order to accommodate the flow of air past the circuit assemblies 106 and the mid plane 104 of the computer subassembly 100 to dissipate heat generated by components on the circuit assemblies 106, gaps are provided above and/or below the mid plane 104. As will be appreciated from FIG. 1, the provision of such gaps requires either an increase in the size of the chassis 102 (i.e., the chassis height in FIG. 1) or a decrease in the size of the mid plane 104. Based on the need for compact computer systems, the provision of such gaps within the chassis 102 for air flow may, therefor, not be preferred.

Referring now to FIG. 2, another embodiment of a mid plane is designated by the numeral "204". In order to accommodate the flow of air through the computer system, the mid plane 204 is provided with restrictive routing channels 206 and air flow cutouts 208. Accordingly, instead of reducing the size of the mid plane 104 or increasing the size of the chassis 102 as described in connection with FIG. 1, a mid plane such as mid plane 204 can be provided with air flow cutouts 208 to accommodate air flow. Such a mid plane 204 may not be preferred, however, because the mid plane 204 (even with the air flow cutouts 208) may nevertheless restrict the flow of air through the computer system. Also, the air flow cutouts 208 make the routing of the midplane very difficult in such a configuration, requiring a tradeoff between air flow holes and routing channels.

Referring now to FIGS. 3–7, exemplary embodiments of the present invention will now be described. Referring to the figures generally, a computer subassembly 300, 400 is configured to be mounted within a rack (not shown) along an insertion axis Ai. The computer subassembly 300, 400 includes a chassis 402 configured for insertion into and removal from a rack along the insertion axis Ai, wherein the chassis 402 at least partially defines an interior 303, 403. An interconnect assembly 304, 404 is mounted within or adjacent the interior 303, 403 of the chassis 402. The interconnect assembly 304, 404 is oriented along a plane that is substantially parallel to the insertion axis Ai. At least one circuit assembly 306, 406A, 406B is positioned at least partially within the interior 303, 403 of the chassis 402 and is configured to be connected to the interconnect assembly 304, 404. The circuit assembly 306, 406A, 406B is oriented in a plane substantially parallel to the insertion axis Ai. A source of cooling air 412 is positioned to direct cooling air through the interior 303, 403 of the chassis 402 along the insertion axis Ai.

The circuit assembly 306, 406A, 406B can be connected to the interconnect assembly 304, 404 along a connection axis Ac oriented at an angle to the insertion axis Ai. That angle between the connection axis Ac and the insertion axis Ai can be about 90 degrees (i.e., the connection axis Ac and insertion axis Ai can be substantially perpendicular with respect to one another).

According to an exemplary method for configuring a rack-mounted computer subassembly for improved cooling, and again referring generally to FIGS. 3–7, the interconnect assembly 304, 404 is oriented in a plane substantially parallel to the insertion axis Ai along which the computer subassembly is inserted into a rack. At least one circuit assembly 306, 406A, 406B can be connected to the interconnect assembly 304, 404 along a connection axis Ac that is angled with respect to the insertion axis Ai, and the circuit assembly 306, 406A, 406B is oriented in a plane substantially parallel to the insertion axis Ai. A source of cooling air 412 is positioned to direct cooling air along the insertion axis.

Figure 3:
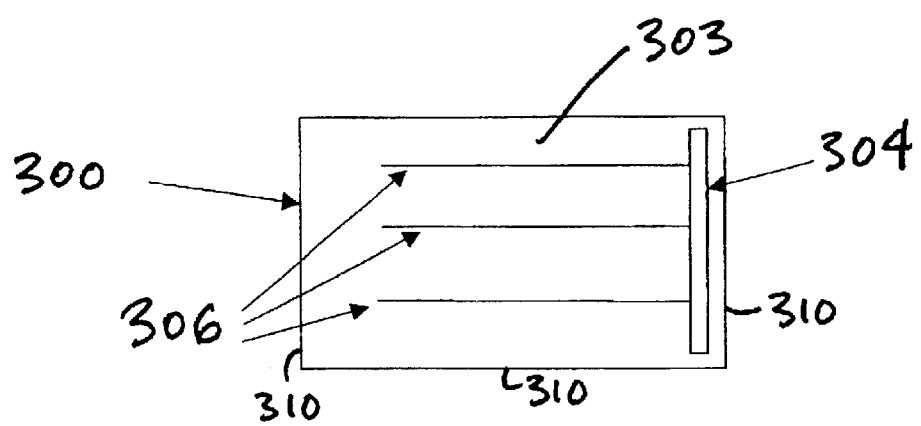
FIG. 3 is a schematic front view of an exemplary embodiment of a computer subassembly according to aspects of this invention.

Referring specifically to the embodiment illustrated schematically in FIG. 3, the computer subassembly 300 includes a chassis including wall portions 310. The chassis can be formed from sheet metal or any other suitable material. The wall portions 310 of the chassis may provide solid, continuous surfaces that substantially or completely enclose an interior region 303 of the chassis. Alternatively, the wall portions 310 of the chassis may merely provide a frame or other structure that at least partially defines the interior 303 of the chassis.

Whether completely or partially enclosed by wall portions 310, the chassis is provided with an access opening that is oriented to permit the insertion of circuit assemblies 306 into the interior 303 of the chassis in a direction along or substantially parallel to the insertion axis Ai, which extends into the page in FIG. 3. The access opening of the chassis is also oriented along the path of cooling air through the chassis.

Though the orientation of the computer subassembly 300 is not critical to the invention, the access opening of the chassis may for example be positioned at the front or rear of the computer assembly. Such an orientation helps to facilitate air flow through the computer subassembly 300 from the front to the back of the subassembly 300 or from the back of the front of the subassembly 300.

The chassis is configured to be inserted along the insertion axis Ai (perpendicular to the page) with respect to a rack (not shown). The chassis, together with wall portions 310, defines the interior 303 into which an interconnect assembly 304 can be positioned. Although interconnect assembly 304 is shown within the interior 303 of chassis in FIG. 3, the interconnect assembly 304 can be positioned outside of the chassis (as in the embodiment illustrated in FIGS. 4–7) or otherwise adjacent the interior 303 of the chassis.

The chassis is sized to accommodate one or more circuit assemblies 306 (3 shown in FIG. 3), which are connected to the interconnect assembly 304 by means of interconnect connectors. More specifically, circuit assemblies 306 are connected to interconnect assembly 304 along a connection access Ac shown in FIG. 3. Though not shown in FIG. 3, connectors on circuit assemblies 306 mate with connectors on interconnect assembly 304 for the communication and transmission of signals and power.

Accordingly, in the exemplary embodiment shown in FIG. 3, the circuit assemblies 306 are installed into the interior of the chassis of the computer subassembly 300 by first inserting the circuit assemblies 306 into the interior 303 of the chassis through an access opening in the front of the chassis and generally along or parallel to the insertion access Ai. The circuit assemblies 306 are then connected to the interconnect assembly 304 by movement of the circuit assemblies along the connection axis Ac. In the embodiment illustrated in FIG. 3, the connection axis Ac is substantially perpendicular to the insertion axis Ai, although other angles between the connection axis Ac and the insertion axis Ai are contemplated as well.

By virtue of the configuration illustrated in FIG. 3, it is possible to orient the interconnect assembly 304 along a plane that is substantially parallel to the insertion axis Ai. It is also possible to orient the circuit assemblies 306 in planes that are also substantially parallel to the insertion axis Ai. By orienting the circuit assemblies 306 and interconnect assembly 304 along planes that are substantially parallel to the insertion axis Ai, cooling air flow passing through the chassis generally along the insertion axis Ai can pass along the surfaces of the circuit assemblies 306 and/or interconnect assembly 304. Such air flow can therefore pass through the interior of the chassis without substantial interference by a mid plane or back plane. Accordingly, in the embodiment illustrated in FIG. 3, while the circuit assemblies 306 and interconnect assembly 304 are all oriented in planes substantially parallel to the insertion axis Ai (and therefore generally parallel to the flow of air), the circuit assemblies 306 are oriented in planes substantially perpendicular to that of the interconnect assembly 304. Although other angles between the planes of the circuit assemblies 306 and the interconnect assembly 304 and the insertion axis Ai are contemplated, it is believed that the orientation illustrated in the exemplary embodiment of the computer subassembly 300 shown in FIG. 3 may optimize the cooling of the system.

In the exemplary embodiment shown in FIG. 3, during installation the circuit assemblies 306 are moved along several axes as they are inserted into the chassis and connected to the interconnect assembly 304. More specifically, they are first moved along an insertion axis Ai and then along a connection axis Ac. It may, therefore, be desirable to add features to the chassis in order to accommodate such manipulation of the circuit assemblies 306. For example, a cam mechanism can be added to the chassis or to the circuit assemblies 306 to accomplish the connection of the circuit assemblies 306 and the interconnect assembly 304 along the connection axis Ac. Such a cam mechanism may help to generate the insertion force necessary to couple a connector on a circuit assembly 306 to a connector on the interconnect assembly 304, in a direction generally along the connection axis Ac. An exemplary cam mechanism is described in co-pending U.S. patent application Ser. No. 10/389,824 which is incorporated herein by reference.

Although not shown in FIG. 3, one or more of the circuit boards 306 can optionally include a connector that is oriented for connection along the insertion axis Ai. For example, in an embodiment having a circuit assembly 306 including one or more processors, it may be necessary or desirable to provide the circuit assembly 306 with a connector to facilitate connection to an input-output (I/O) board. If the I/O board has a connector oriented along the insertion axis Ai, the circuit assembly 306 can be provided with a mating I/O connector so oriented as well as one or more interconnect connectors oriented along the connection axis Ac. Accordingly, one or more circuit assemblies 306 can have connectors oriented along angled axes Al and Ac. If such connectors are provided on a particular circuit assembly 306, a connector oriented along the insertion axis Ai is preferably connected first followed by the connection of the connector oriented along the connection axis Ac, or vice versa.

Figure 4:
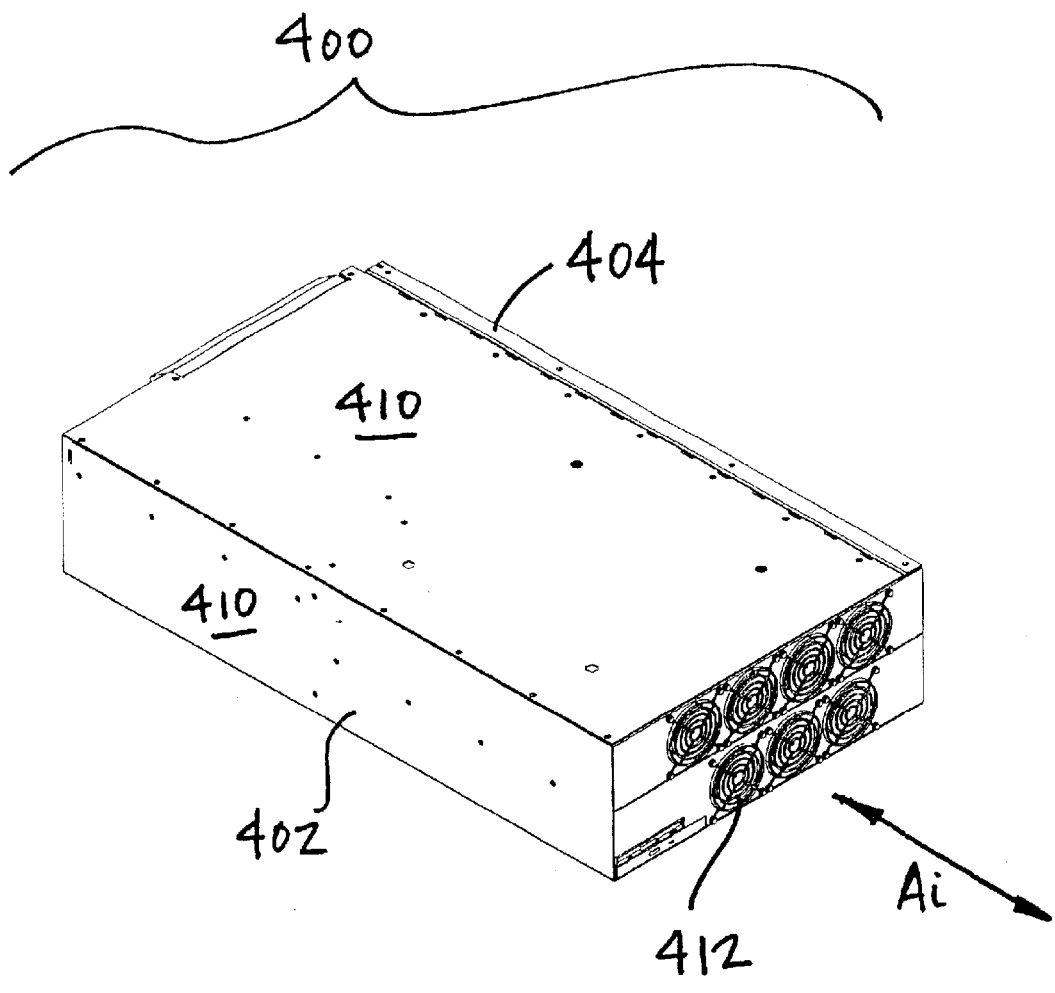
FIG. 4 is a perspective view of another exemplary embodiment of a computer subassembly according to aspects of this invention.

Referring now to FIGS. 4–7, another exemplary embodiment of a computer subassembly, generally designated by the numeral "400", will now be described. As shown in FIG. 4, the computer subassembly 400 is similar to the computer subassembly 300 in that it includes a chassis 402 having wall portions 410 and an interconnect assembly 404. Computer subassembly 400 also includes a cooling source 412 which, in this embodiment, includes a plurality of box fans oriented to direct cooling air flow along the insertion axis Ai of the computer subassembly 400.

Figure 6:
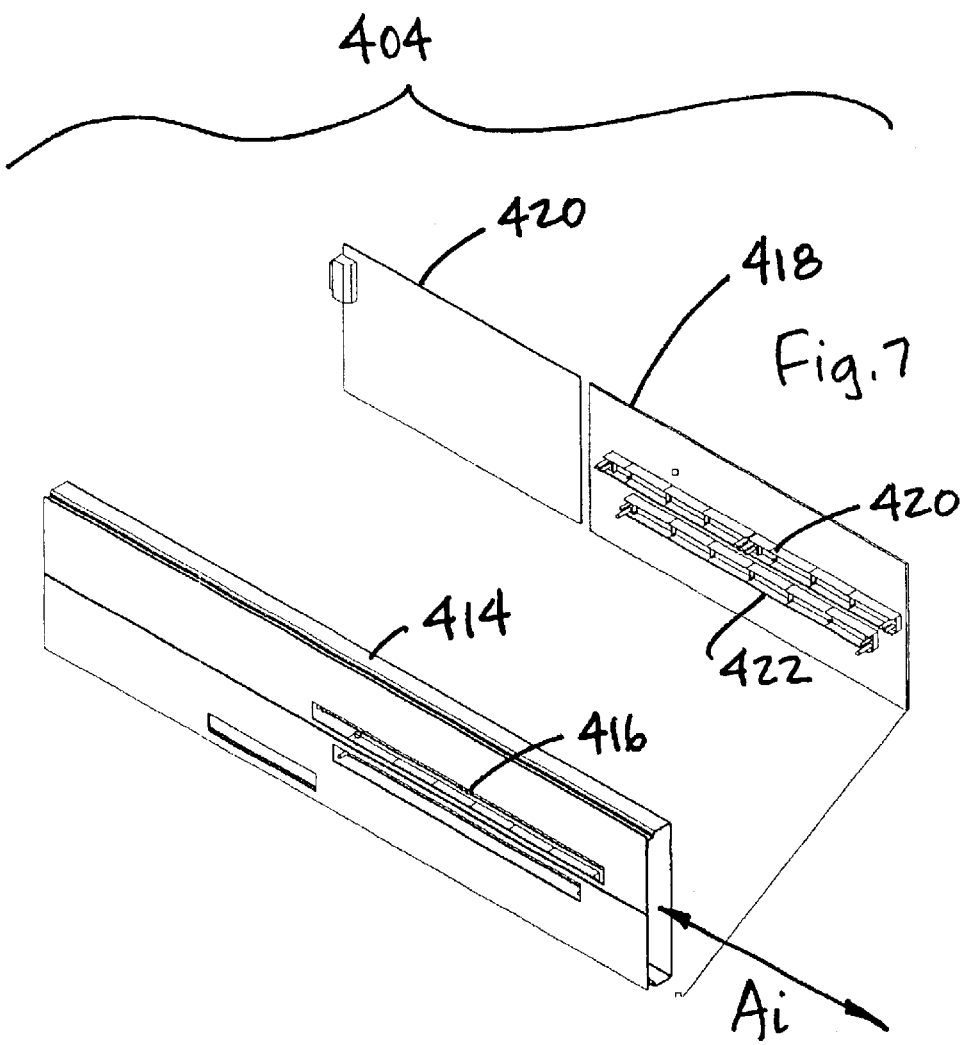
FIG. 6 is a perspective view of an exemplary embodiment of an interconnect assembly configured for use in the computer subassembly illustrated in FIG. 4.

Computer subassembly 400 differs from computer assembly 300 in that the interconnect assembly 404 of the computer subassembly 400 is located adjacent to (but not within) the interior of the chassis 402. The modular interconnect assembly 404 will be described later with reference to: FIGS. 6 and 7. In order to move the interconnect assembly 404 with respect to the chassis 402, the banks of box fans (cooling source 412) can be moved, and the interconnect assembly 404 can be moved in a direction generally parallel to the insertion axis Ai.

The computer subassembly 400 illustrated in FIG. 4 is a modular computer subassembly that is configured for use in a scalable computer system. Accordingly, multiple subassemblies like or substantially identical to computer subassembly 400 can be interconnected to form a larger computer system. Each computer subassembly 400 may be configured such that it can be removed and replaced while the remainder of the computer system is running. Also, the computer subassembly 400 is optionally configured such that one or more circuit assemblies can be swapped out of the interior of the computer subassembly 400.

Figure 5:
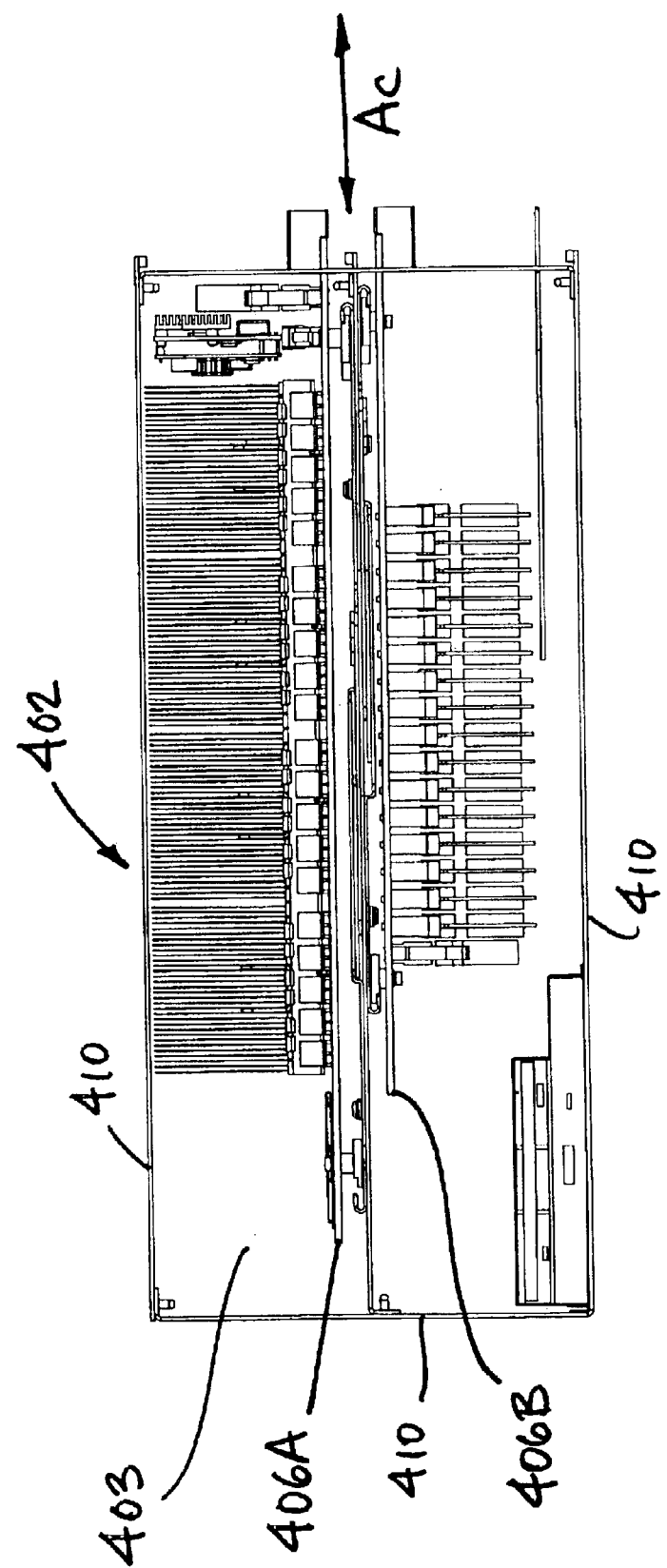
FIG. 5 is a front view of a portion of the computer subassembly illustrated in FIG. 4.

Referring now to FIG. 5, the computer subassembly 400 is illustrated with the cooling source 412 and the interconnect assembly 404 removed. The computer subassembly 400 includes a chassis 402 that, by means of wall portions 410, defines an interior 403. A plurality of circuit assemblies can be accommodated within the interior 403 of the chassis 402. Specifically in the embodiment illustrated in FIG. 5, the chassis 402 is sized to accommodate a processor circuit assembly 406A and a memory circuit assembly 406B.

The circuit assemblies 406A and 406B are inserted into the interior of the chassis 402 along an insertion axis Ai that is perpendicular to the page as illustrated in FIG. 5. The circuit assemblies 406A and 406 5 are then connected to the interconnect assembly (not shown in FIG. 5) by moving each circuit assembly 406A and 406B along the connection axis Ac (to the right in FIG. 5). The interconnect assembly 404 is positioned adjacent the outer surface of the wall portion on the right-hand side of the chassis 402. Openings in the chassis 402 accommodate interconnect connectors that are attached to the circuit assemblies 406A and 406B for engagement to the interconnect assembly 404.

Referring now to FIGS. 6 and 7, an exemplary embodiment of an interconnect assembly 404 is illustrated. As stated previously, the interconnect assembly 404 is modular with respect to a computer system in the illustrated embodiment in that it can be installed and removed along an axis parallel to the insertion axis Ai.

Referring specifically to FIG. 6, the interconnect assembly 404 includes a chassis 414 having a plurality of access openings 416. The access openings 416 accommodate the interconnect connectors extending from the circuit assemblies 406A and 406B mounted within the chassis 402 of the computer subassembly 400.

Referring now to FIG. 75 components of the interconnect assembly 404 are illustrated. Specifically, a printed circuit assembly 418 is configured to be mounted within the interior of the chassis 414 of the interconnect assembly 404. In this embodiment, the printed circuit assembly 418 forms a component of a Cellular Interconnect Module (CIM). The printed circuit assembly 418 includes an interconnect connector 420 positioned for interconnection with the circuit assembly 406A of the computer subassembly 400. The printed circuit assembly 418 also includes an interconnect connector 422 for interconnection with the circuit assembly 406B of the computer subassembly 400.

The interconnect assembly 404 also includes a printed circuit assembly 420. The printed circuit assemblies 418 and 420 are oriented so that they reside in a plane that is substantially parallel to the insertion axis Ai. In such a configuration, the interconnect assembly 404 does not substantially interfere with the flow of cooling air flowing from the front to the back of the rack-mounted computer system.

Referring now to FIGS. 8 through 11, the manner in which the circuit assemblies 406A and 406B are installed in the chassis 402 will be described. A shelf or other divider is provided in the interior 403 of chassis 402 in order to separate the interior 403 of the chassis 402 into a processor region (the top portion in FIG. 8) and a memory region (the bottom portion in FIG. 8).

Figure 8:
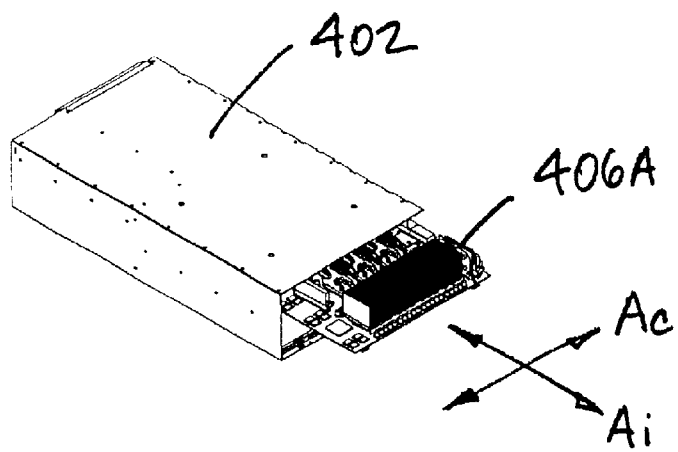
FIG. 8 is a perspective view of components of the computer subassembly illustrated in FIG. 5.
Figure 9:
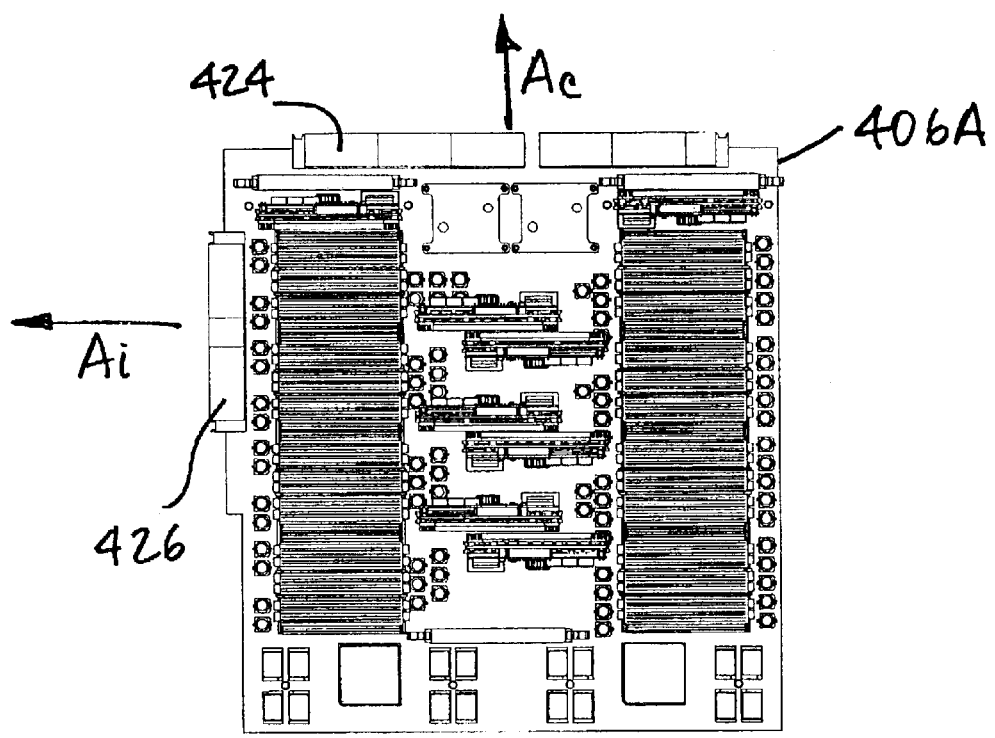
FIG. 9 is a plan view of an exemplary embodiment of a processor circuit assembly 406A according to aspects of this invention.

Referring specifically to FIG. 8, a processor circuit assembly 406A is shown partially inserted into the processor region of the chassis 402 along the insertion axis Ai. Upon complete insertion of the processor circuit assembly 406A into the interior 403 of the chassis 402 along the insertion axis Ai, the processor circuit assembly 406A is connected to an interconnect assembly (not shown in FIG. 8) along a connection axis Ac. Referring to FIG. 9, which illustrates an exemplary embodiment of a processor circuit assembly 406A, the processor circuit assembly 406A includes an interface connector 424 that is oriented for connection along the connection axis Ac. The processor circuit assembly 406A also includes an I/O connector 426 that is oriented for connection to a mating connector within the chassis 402 along the insertion axis Ai.

Figure 10:
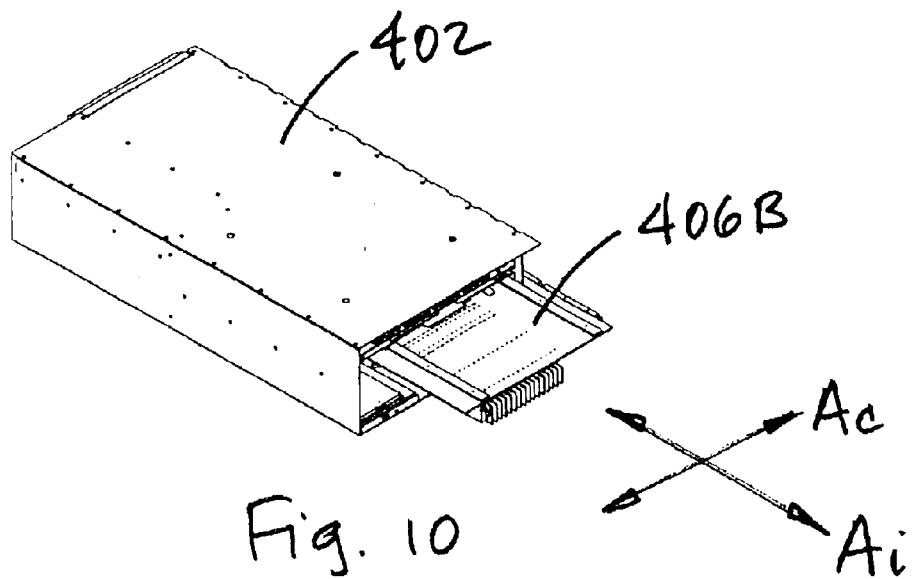
FIG. 10 is another perspective view of components of the computer subassembly illustrated in FIG. 5.
Figure 11:
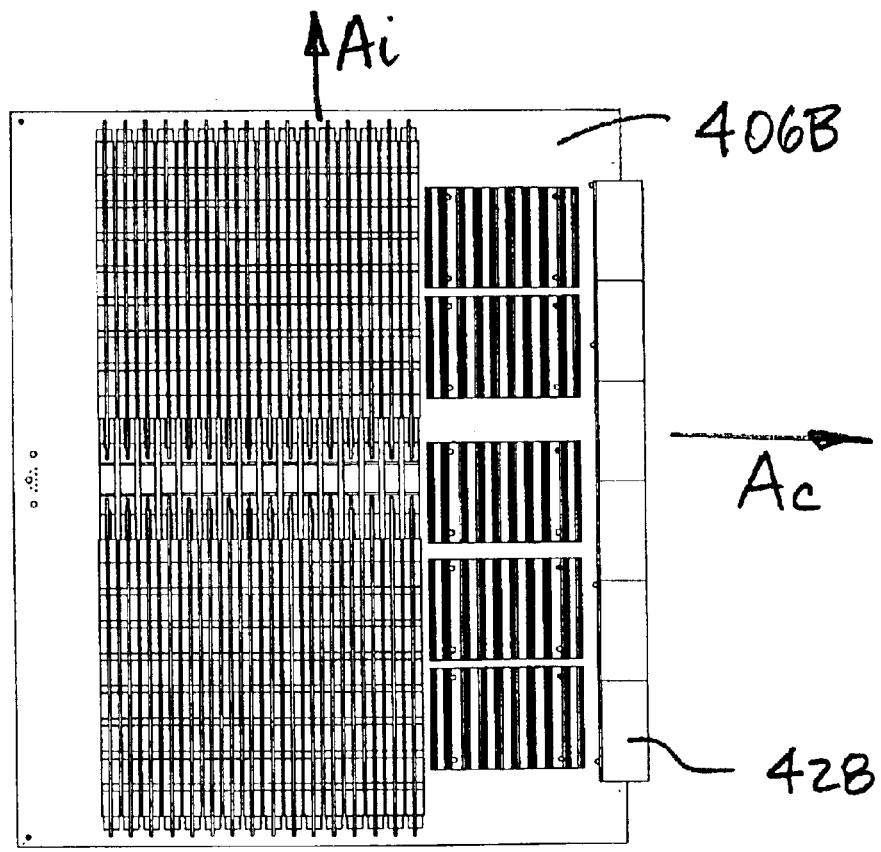
FIG. 11 is a plan view of an exemplary embodiment of a memory circuit assembly 406B according to aspects of this invention.

Referring now to FIG. 10, the memory circuit assembly 406B is shown partially inserted within the interior 403 of the chassis 402. Upon complete insertion of the memory circuit assembly 406B into the chassis 402 along the insertion axis Ai the memory circuit assembly 406B can be connected to an interconnect assembly (not shown) along the connection axis Ac. Referring to FIG. 10, the exemplary memory circuit assembly 406B includes an interconnect or interface connector 428 that is oriented for connection along the connection axis Ac.

In use, the modular computer subassemblies 300 and 400 can be installed in a rack-mounted computer system in a fully assembled condition (i.e., with one or more circuit assemblies mounted within a chassis and connected to an interconnect assembly that is either within or adjacent the interior of the chassis). Alternatively, the circuit assemblies can be installed into the interior of the chassis and interconnected to an interconnect assembly after the chassis has already been installed within the rack.

The interconnect assembly, though shown adjacent to a side wall of a chassis, can alternatively be positioned at a location that is spaced from one or more walls of the chassis. For example, the interconnect assembly can be positioned centrally within the chassis of the computer subassembly as a mid plane. In such a position, circuit assemblies could then be connected to both sides of the interconnect assembly. Also, although the interconnect assembly of the illustrated embodiments is oriented along a substantially vertical plane, the interconnect assembly can be positioned horizontally or at any angle to horizontal. Preferably, however, the interconnect assembly (whether vertical, horizontal or otherwise positioned) will be oriented along a plane that is substantially parallel to the axis of cooling air flow for the computer subassembly.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. A computer subassembly configured to be mounted within a rack along an insertion axis, said computer subassembly comprising:

a chassis configured for insertion into and removal from the rack along said insertion axis, said chassis at least partially defining an interior;

an interconnect assembly mounted within or adjacent said interior of said chassis; and at least one circuit assembly positioned at least partially within said interior of said chassis and connected to said interconnect assembly, said circuit assembly being configured for insertion into and removal from said interior of said chassis along said insertion axis, and said circuit assembly being configured for connection to said interconnect assembly along a connection axis oriented at an angle to said insertion axis; and a source of cooling air positioned to direct cooling air through said interior of said chassis along said insertion axis.

2. The computer subassembly recited in claim 1, said chassis having wall portions defining said interior of said chassis.

3. The computer subassembly recited in claim 1, wherein said interconnect assembly is mounted within said interior of said chassis.

4. The computer subassembly recited in claim 1, wherein said interconnect assembly is mounted adjacent said interior of said chassis.

5. The computer subassembly recited in claim 1, wherein said connection axis is substantially perpendicular to said insertion axis.

6. The computer subassembly recited in claim 2, wherein a plane in which said interconnect assembly is oriented is substantially parallel to at least one of said wall portions of said chassis.

7. The computer subassembly recited in claim 6, wherein said interconnect assembly is positioned adjacent said wall portion of said chassis.

8. The computer subassembly recited in claim 6, wherein said interconnect assembly is spaced from said wall portion of said chassis.

9. A computer subassembly configured to be mounted within a rack along an insertion axis, said computer subassembly comprising:

a chassis configured for insertion into the rack along said insertion axis, said chassis at least partially defining an interior and an access opening positioned along said insertion axis;

an interconnect assembly mounted within or adjacent said interior of said chassis; and at least one circuit assembly positioned at least partially within said interior of said chassis and connected to said interconnect assembly, said circuit assembly being sized for insertion and removal through said access opening of said chassis and into said interior of said chassis along said insertion axis, said circuit assembly being connected to said interconnect assembly along a connection axis oriented at an angle to said insertion axis; and a source of cooling air positioned to direct cooling air through said interior of said chassis along said insertion axis.

10. The computer subassembly recited in claim 9, wherein said interconnect assembly is mounted within said interior of said chassis.

11. The computer subassembly recited in claim 9, wherein said interconnect assembly is mounted adjacent said interior of said chassis.

12. The computer subassembly recited in claim 9, wherein said circuit assembly is configured for insertion into and removal from said interior of said chassis along said insertion axis.

13. The computer subassembly recited in claim 9, wherein said connection axis is substantially perpendicular to said insertion axis.

14. A rack-mounted computer assembly, said computer assembly comprising a plurality of subassemblies, each of said subassemblies having:

a chassis configured for insertion into and removal from the rack along an insertion axis, said chassis at least partially defining an interior;

at least one circuit assembly positioned at least partially within said interior of said chassis, said circuit assembly being configured for insertion into and removal from said interior of said chassis along said insertion axis, and said circuit assembly having an interconnect connector oriented for connection along a connection axis at an angle to said insertion axis; and a source of cooling air positioned to direct cooling air through said interior of said chassis along said insertion axis.

15. The computer assembly recited in claim 14, wherein said connection axis is substantially perpendicular to said insertion axis.

16. A method for configuring a rack-mounted computer subassembly for improved cooling, said method comprising the steps of:

(a) orienting an interconnect assembly in a plane substantially parallel to an insertion axis along which a computer subassembly is inserted into a rack;

(b) connecting at least one circuit assembly, configured for insertion into and removal from an interior of the computer subassembly along the insertion axis, to the interconnect assembly along a connection axis angled with respect to the insertion axis; and (c) positioning a source of cooling air to direct cooling air along the insertion axis.

17. The method recited in claim 16, wherein said connecting step comprises inserting the circuit assembly into the computer subassembly along the insertion axis.

18. The method recited in claim 16, wherein said connecting step comprises connecting the circuit assembly along a connection axis oriented substantially perpendicular to the insertion axis.

* * * * *